United States Patent
Cardin et al.

(10) Patent No.: US 9,263,859 B2
(45) Date of Patent: Feb. 16, 2016

(54) DEVICE HAVING A PIVOTING WALL WITH A CABLE CRADLE

(75) Inventors: Daniel Cardin, Sainte-Julie (CA); Daniel Lalancette, St-Jean-Sir-Richelieu (CA)

(73) Assignee: THOMAS & BETTS INTERNATIONAL, INC., Wilmington, DE (US)

( * ) Notice: Subject to any disclaimer, the term of this patent is extended or adjusted under 35 U.S.C. 154(b) by 0 days.

(21) Appl. No.: 13/486,136

(22) Filed: Jun. 1, 2012

(65) Prior Publication Data

US 2013/0137294 A1    May 30, 2013

Related U.S. Application Data

(60) Provisional application No. 61/492,142, filed on Jun. 1, 2011.

(51) Int. Cl.
| | |
|---|---|
| *H01R 4/40* | (2006.01) |
| *H02B 1/03* | (2006.01) |
| *H01R 11/15* | (2006.01) |
| *G01R 11/04* | (2006.01) |

(52) U.S. Cl.
CPC .. *H02B 1/03* (2013.01); *H01R 4/40* (2013.01); *H01R 11/15* (2013.01); *G01R 11/04* (2013.01)

(58) Field of Classification Search
CPC .......................................................... H01R 4/40
USPC ................... 439/761–772, 789, 781
See application file for complete search history.

(56) References Cited

U.S. PATENT DOCUMENTS

| | | | | |
|---|---|---|---|---|
| 2,216,309 | A * | 10/1940 | Bissell | 439/791 |
| 2,791,623 | A | 5/1957 | Lock et al. | |
| 3,113,822 | A * | 12/1963 | Sorflaten | 439/814 |
| 3,118,720 | A | 1/1964 | Shuck et al. | |
| 3,177,459 | A * | 4/1965 | Toedtman | 439/781 |
| 3,406,372 | A | 10/1968 | Lawlor | |
| 3,973,821 | A | 8/1976 | Scott et al. | |
| 3,980,381 | A * | 9/1976 | Cornell | 439/427 |
| 4,128,294 | A * | 12/1978 | McCord | 439/789 |
| 4,357,068 | A | 11/1982 | Cornell et al. | |
| 4,548,462 | A * | 10/1985 | Cornell | 439/789 |
| 4,601,600 | A | 7/1986 | Karlsson | |
| 4,723,920 | A * | 2/1988 | Werner | 439/782 |
| 4,734,062 | A * | 3/1988 | Goto | 439/783 |
| 4,898,551 | A | 2/1990 | Cornell | |
| 5,269,710 | A | 12/1993 | Donnerstag | |
| 5,401,194 | A * | 3/1995 | Cornell | 439/789 |
| 5,690,516 | A * | 11/1997 | Fillinger | 439/798 |
| 5,704,816 | A * | 1/1998 | Polidori | 439/781 |
| 5,752,860 | A | 5/1998 | Greaves | |
| 6,325,677 | B1 | 12/2001 | Tamm | |

(Continued)

FOREIGN PATENT DOCUMENTS

| | | |
|---|---|---|
| CA | 2070306 C | 1/1993 |
| CA | 2137413 C | 7/1995 |

(Continued)

*Primary Examiner* — Chandrika Prasad
(74) *Attorney, Agent, or Firm* — Butler Snow LLP

(57) ABSTRACT

A new connector for attaching conductor wires to a meter-socket is disclosed. The design of the connector allows the wires to be laid in along the side of the connector and requires little bending and slack in the wire. Once seated in place, the connector can be secured using a set screw that keeps the conductor wire in place.

21 Claims, 4 Drawing Sheets

(56) References Cited

U.S. PATENT DOCUMENTS

| | | |
|---|---|---|
| 6,347,967 B1 | 2/2002 | Tamm |
| 6,971,925 B1 | 12/2005 | Orange |
| 7,097,518 B2 | 8/2006 | Kraemer et al. |
| 7,677,933 B2 | 3/2010 | Copper et al. |

FOREIGN PATENT DOCUMENTS

| | | |
|---|---|---|
| CA | 2131684 C | 3/1996 |
| CA | 2189578 C | 5/1997 |
| CA | 2287637 C | 12/2002 |
| CA | 2545518 A1 | 7/2005 |
| CA | 2487392 C | 11/2005 |
| CA | 2496349 C | 11/2005 |
| CA | 2616202 A1 | 2/2007 |
| CA | 2548851 A1 | 9/2007 |
| CA | 2630244 A1 | 11/2007 |
| CA | 2618138 A1 | 8/2008 |
| CA | 2629188 A1 | 10/2008 |
| CA | 2683284 A1 | 11/2008 |
| CA | 2685765 A1 | 11/2008 |
| CA | 2703937 A1 | 5/2009 |
| CA | 2676943 A1 | 3/2010 |

* cited by examiner

DEVICE HAVING A PIVOTING WALL WITH A CABLE CRADLE

CROSS REFERENCE TO RELATED APPLICATIONS

This application claims the benefit of U.S. Provisional Application No. 61/492,142, filed on Jun. 1, 2011, which is incorporated herein by reference in its entirety.

FIELD OF THE INVENTION

The present invention is generally directed toward an electrical connector. More specifically, it is directed toward wiring connectors used in the bases of metersockets.

BACKGROUND OF THE INVENTION

Electrical wiring connections often must be made in confined spaces. This is particularly problematic in the case of metersockets where all connections must be made within the metersocket base. The service entrance line and load conductors that are used with metersockets are typically made of a very large gauge wire that is capable of handling amperage required by the building. Due to their thickness and stiffness, the large gauge wires are very difficult to maneuver into proper position within the metersocket base.

In order to attach the service entrance line and load conductors to the meter base, a portion of the insulating jacket is removed from the conductor, exposing strands of wire. The conductor is, then, bent at an angle so that it is perpendicular to an opening in the connector just slightly larger than the conductor. The bare end of the conductor is, then, pushed through the opening of the connector and secured by torquing a lug or set screw in the conductor. Due to the confined spaces within the meter base, the thickness of the wire, and the desire to have very little slack in the conductor, it is very difficult to maneuver the conductor into the opening in the connector. Furthermore, because the conductor has been stripped of insulation at the tip, the conductor may fray as it is maneuvered into place. The frayed strands of conductor make it even more difficult to insert into the small opening in the connector.

SUMMARY OF THE INVENTION

An improved electrical connector is disclosed which allows the conductors to be attached to the connector through the side of the connector instead of pushing the conductor through a hole in the connector. The conductors can simply be laid into place on the connector and, then, secured with the set screw.

BRIEF DESCRIPTION OF THE DRAWINGS

Further advantages of the invention will become apparent by reference to the detailed description of preferred embodiments when considered in conjunction with the drawings.

DETAILED DESCRIPTION

The following detailed description is presented to enable any person skilled in the art to make and use the invention. For purposes of explanation, specific details are set forth to provide a thorough understanding of the present invention. However, it will be apparent to one skilled in the art that these specific details are not required to practice the invention. Descriptions of specific applications are provided only as representative examples. Various modifications to the preferred embodiments will be readily apparent to one skilled in the art, and the general principles defined herein may be applied to other embodiments and applications without departing from the scope of the invention. The present invention is not intended to be limited to the embodiments shown, but is to be accorded the widest possible scope consistent with the principles and features disclosed herein.

Figure 1A:
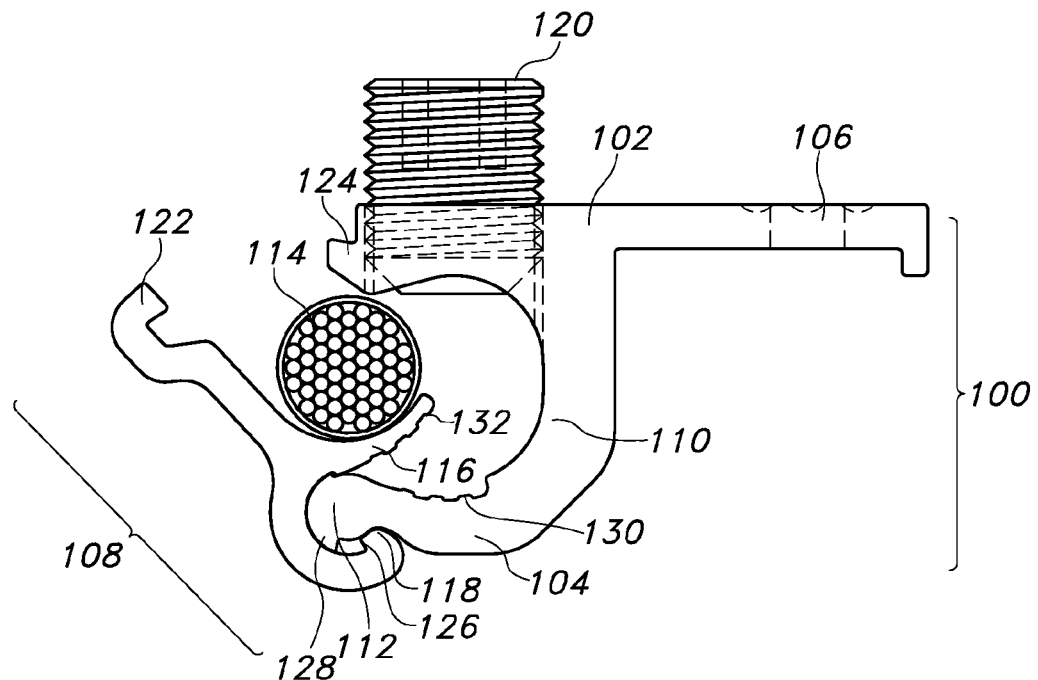
FIG. 1A depicts an embodiment of the claimed connector in the open position.
Figure 4A:
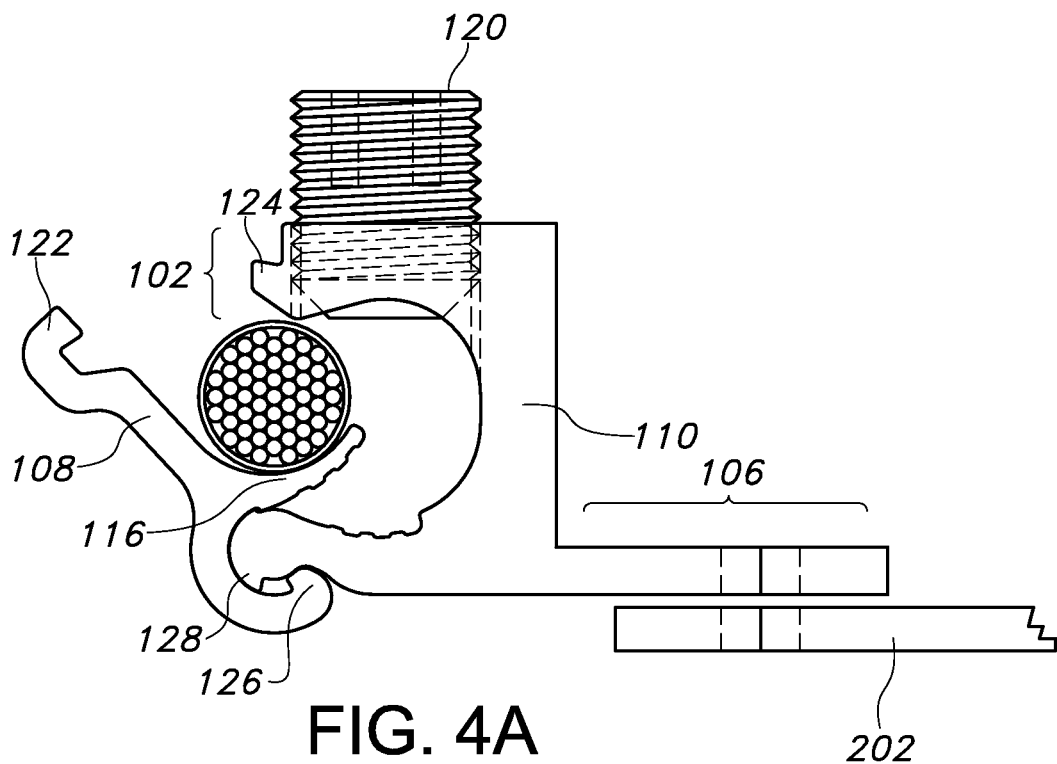
FIG. 4A depicts an embodiment of the connector for use with a hub bus.
Figure 4B:
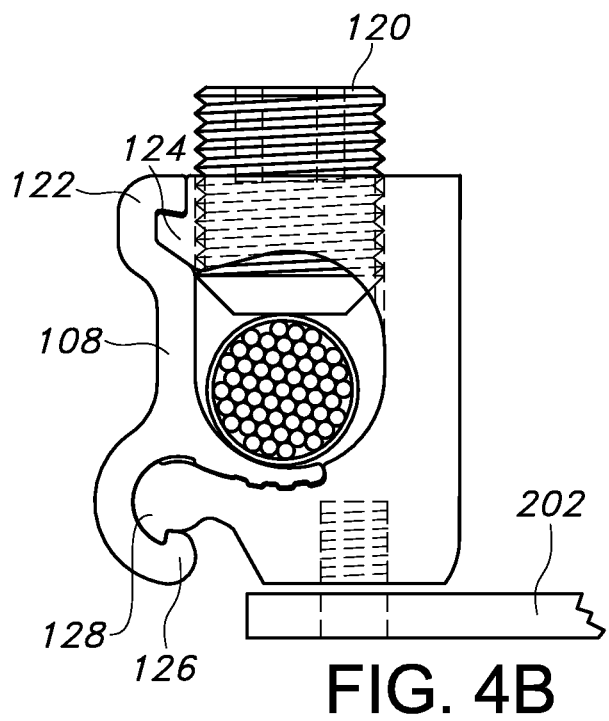
FIG. 4B depicts an embodiment of the connector without a mounting bracket.

Referring to the drawings, FIG. 1A illustrates an exemplary embodiment of the connector. In one embodiment, the connector comprises a connector body 100 having an upper member 102 and a lower support member 104. When installed in a meter base 201, lower support member 104 would be closest to the back panel of the meter base 201, and upper member 102 would face out toward the meter. The connector body also includes a mounting bracket 106 for attaching the connector to the meter base 201. The mounting bracket 106 may be located anywhere on the connector body to allow for different mounting scenarios with solid objects (e.g., meter base/metersocket base 201 or bus bar/hub bus 202). For example, if the connectors are to be used with a bus bar 202, mounting bracket 106 may be located closer to lower support member 104, as depicted in FIG. 4A. As can be seen from FIG. 4B, the connector can be designed without a mounting bracket 106 with the lower support member 104 being mounted directly to the meter base/metersocket base 201 or bus bar/hub bus 202 by use of a bolt passing through connector body 100.

Figure 1B:
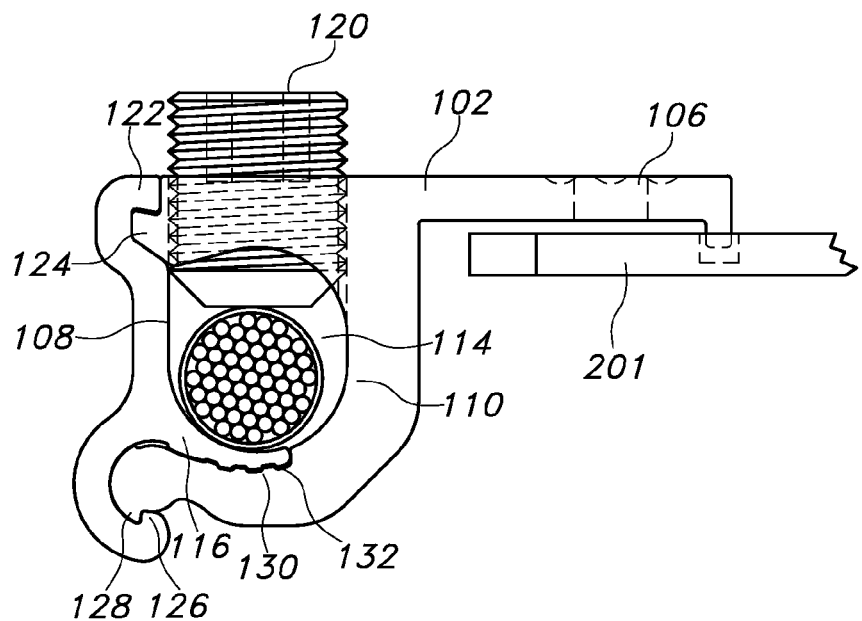
FIG. 1B depicts an embodiment of the claimed connector in the closed position.

The connector has a moving part, referred to herein as pivoting wall 108. This pivoting wall 108 attaches to lower support member 104 by means of hinge 112. Cable cradle 116 extends out from pivoting wall 108 toward inner sidewall 110. Pivoting wall 108 can pivot about hinge 112 to an open position, as depicted in FIG. 1A, and to a closed position, as depicted in FIG. 1B. In an open position, the gap between pivoting wall 108 and upper member 102 is wider than the diameter of conductor 114 so that the conductor 114 can pass through the gap and be laid against cable cradle 116. Once the conductor 114 has been laid against cable cradle 116, pivoting wall 108 can be moved to a closed position, causing conductor 114 to be trapped within the recessed space defined by the upper member 102, inner sidewall 110 and lower support member 104.

In one embodiment, the design of the connector includes a mechanism to prevent the pivoting wall 108 from swinging too far open. If pivoting wall 108 were to swing too far out, conductor 114 could become trapped under cable cradle 116, thus preventing pivoting wall 108 from being moved to a closed position. One mechanism of preventing pivoting wall 108 from swinging too far out is lower stopper 118. Lower stopper 118 is configured to extend from pivoting wall 108 around hinge 112 such that it will come into contact with lower support member 104 thus preventing pivoting wall 108 from opening too far.

Figure 2A:
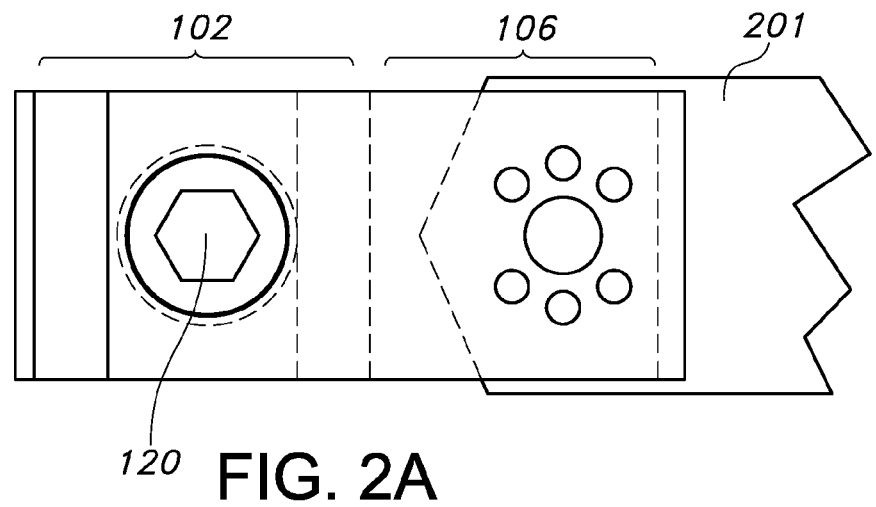
FIG. 2A is a top plan view of an embodiment of the claimed device.
Figure 3A:
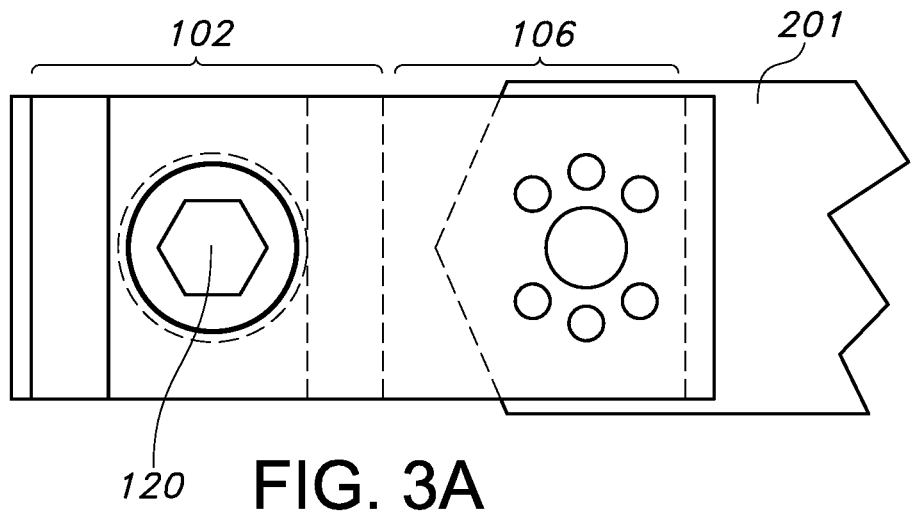
FIG. 3A is a top plan view of an embodiment of the claimed device.

Once conductor 114 has been laid onto cable cradle 116 and pivoting wall 108 has been moved to a closed position, conductor 114 can be secured in place by use of set screw 120 located in upper member 102. Set screw 120 is a bolt or other threaded member that can engage with the inner threads of a hole in upper member 102. As can be seen from FIG. 2A or FIG. 3A set screw 120 preferably is an allen screw, although any threaded member may be used. As set screw 120 is turned in a tightening direction, it moves through upper member 102 toward lower support member 104. If a conductor 114 is located in cable cradle 116, and pivoting wall 108 is sufficiently closed, the set screw 120 will come in contact with conductor 114 as it is tightened. Set screw 120 will apply a force in the direction of lower support member 104, preventing pivoting wall 108 from swinging open, and preventing conductor 114 from moving.

As viewed from the side, as in FIG. 1B, as the set screw 120 is tightened, it exerts a downward force against lower support member 104. This downward force would push against lower support member 104, potentially forcing it to deform and causing it to move away from upper member 102. However, lower support member 104 is anchored in place by upper anchor 122, located on pivoting wall 108. Upper anchor 122 is configured to engage with upper anchor lip 124, located on upper member 102. Any downward force from set screw 120 results in a downward application of force of upper anchor 122 against upper anchor lip 124, thus preventing lower support member 104 from moving downward.

Figure 2B:
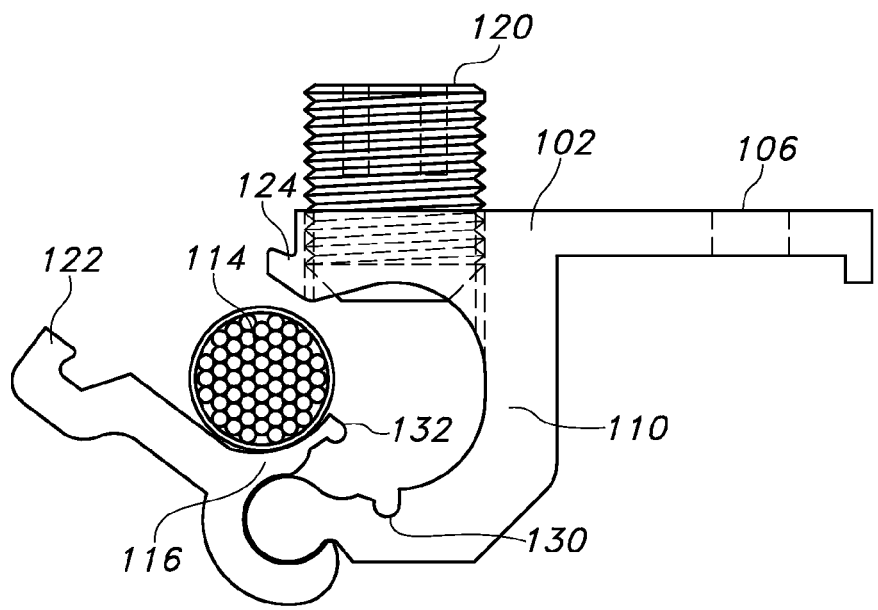
FIG. 2B depicts an embodiment of the claimed connector in the open position.
Figure 3B:
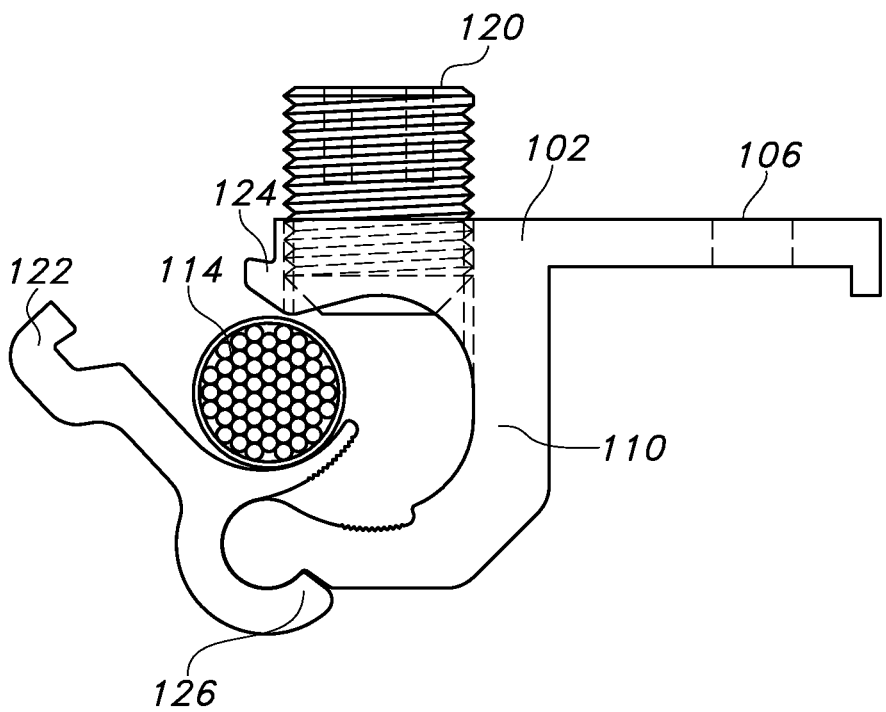
FIG. 3B depicts an embodiment of the claimed connector in the open position.

As set screw 120 is tightened, conductor 114 may compress into an elliptical shape, causing pressure to be applied against pivoting wall 108 and inner sidewall 110. Potentially, this pressure may cause hinge 112 to deform or pivoting wall 108 to separate from hinge 112. In a preferred embodiment, lower anchor 126, located on pivoting wall 108, is configured to engage with lower anchor lip 128 to ensure that the outward pressure from the compressing conductor 114 does not result in pivoting wall 108 being pushed out. In order to further prevent pivoting wall 108 from being pushed outward, lower anchoring grooves 130 in lower support member 104 may engage with upper anchoring grooves 132 at the base of cable cradle 116. The interlocking of the lower anchoring grooves 130 and the upper anchoring grooves 132 will prevent pivoting wall 108 from being pushed away from connector body 100. The number of anchoring grooves may vary from just one, as shown in FIG. 2B, to several, as depicted in FIG. 1B, or there may not even be any, as depicted in FIG. 3B.

The connector can be made of just three parts: pivoting wall 108, set screw 120, and the connector body 100. Ideally these three parts would be extruded, cast or machined from a hard conductive metal or alloy that does not deform. It is contemplated that the connector body 100 may be built directly into the edge of a solid surface. In such an instance, the recessed space where the conductor would be secured would be a groove cut into the edge of the solid surface.

The design of the disclosed connector makes attachment of conductors to the meter base 201 significantly easier. The installer simply flips pivoting wall 108 to an open position and lays conductor 114 onto cable cradle 116. The conductor 114 only has to be bent slightly in order to place the conductor 114 on the cable cradle 116, and no slack in the wire is required to place the conductor 114 on the cable cradle 116. Pivoting wall 108 is, then, pushed into the closed position, causing conductor 114 to be enclosed within the recessed space of the connector. Set screw 120 is, then, tightened to secure the conductor 114 in place. Not only does set screw 120 prevent pivoting wall 108 from opening, but the pressure of set screw 120 against the conductor 114 also increases the surface contact of the conductor 114 to the connector. Furthermore, it also prevents the conductor 114 from being pulled out of the connector in the direction of the connector wire.

Unlike connectors of the prior art, the claimed design allows for easier installations since the heavy gauge wire does not have to be maneuvered into a position to get the wire in through the front of the connector. Also, no slack in the wire is required, and less working space is required in the meter box. Also, unlike connectors that require separate lugs, there are no pieces to drop or lose.

The terms "comprising," "including," and "having," as used in the claims and specification herein, shall be considered as indicating an open group that may include other elements not specified. The terms "a," "an," and the singular forms of words shall be taken to include the plural form of the same words, such that the terms mean that one or more of something is provided. The term "one" or "single" may be used to indicate that one and only one of something is intended. Similarly, other specific integer values, such as "two," may be used when a specific number of things is intended. The terms "preferably," "preferred," "prefer," "optionally," "may," and similar terms are used to indicate that an item, condition or step being referred to is an optional (not required) feature of the invention.

The invention has been described with reference to various specific and preferred embodiments and techniques. However, it should be understood that many variations and modifications may be made while remaining within the spirit and scope of the invention. It will be apparent to one of ordinary skill in the art that methods, devices, device elements, materials, procedures and techniques other than those specifically described herein can be applied to the practice of the invention as broadly disclosed herein without resort to undue experimentation. All art-known functional equivalents of methods, devices, device elements, materials, procedures and techniques described herein are intended to be encompassed by this invention. Whenever a range is disclosed, all subranges and individual values are intended to be encompassed. This invention is not to be limited by the embodiments disclosed, including any shown in the drawings or exemplified in the specification, which are given by way of example and not of limitation.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

All references throughout this application, for example patent documents including issued or granted patents or equivalents, patent application publications, and non-patent literature documents or other source material, are hereby incorporated by reference herein in their entireties, as though individually incorporated by reference, to the extent each reference is at least partially not inconsistent with the disclosure in the present application (for example, a reference that is partially inconsistent is incorporated by reference except for the partially inconsistent portion of the reference).

We claim:

1. A device for connecting an electrical conductor to a solid object comprising:
   a. a recessed space within which said electrical conductor will be secured;

b. a pivoting wall with a cable cradle capable of pivoting into said recessed space, wherein the cable cradle extends from said pivoting wall into said recessed space and the cable cradle contacts an outer surface of said recessed space when said electrical conductor is secured; and c. a terminal screw for securing said electrical conductor within said recessed space.

2. The device of claim 1 wherein said pivoting wall with the cable cradle is made of metal.

3. The device of claim 1 further comprising a metal bracket for attachment to said solid object.

4. The device of claim 1 wherein said solid object is a metersocket base.

5. The device of claim 1 wherein said solid object is a bus bar.

6. The device of claim 1 further comprising anchoring grooves on the cable cradle and the outer surface of said recessed space, said anchoring grooves configured to prevent said pivoting wall with the cable cradle from slipping away from said recessed space.

7. The device of claim 1 further comprising an upper anchor on said pivoting wall with the cable cradle, said upper anchor configured to hook on an upper lip of said recessed space.

8. The device of claim 1 further comprising a stopper on said pivoting wall with the cable cradle, said stopper configured to limit the distance of rotational travel of said pivoting wall with the cable cradle.

9. A device for connecting an electrical conductor to a solid object comprising:

a. an upper member;

b. an inner sidewall extending from said upper member;

c. a lower support member extending from said inner sidewall such that a recessed space is formed by said upper member, said inner sidewall, and said lower support member and wherein said electrical conductor will be secured;

d. a hinged pivoting wall with a cable cradle which extends from said hinged pivoting wall into said recessed space capable of supporting said electrical conductor and said hinged pivoting wall with the cable cradle capable of pivoting between an open position and a closed position, wherein a surface, on the cable cradle, facing said lower support member contacts a surface, on said lower support member, facing the cable cradle when said hinged pivoting wall with the cable cradle is secured in said closed position.

10. The device of claim 9 wherein said upper member, inner sidewall, lower support member, and hinged pivoting wall with the cable cradle are metal.

11. The device of claim 9 further comprising a threaded screw hole within said upper member and a set screw configured to engage with the threads of said threaded screw hole and move toward said lower support member as rotated.

12. The device of claim 11 wherein said set screw will press against said electrical conductor and prevent movement of said electrical conductor.

13. The device of claim 11 wherein said set screw will prevent said hinged pivoting wall with the cable cradle from pivoting between said open position and said closed position.

14. The device of claim 9 further comprising a metal bracket.

15. The device of claim 9 wherein said solid object is a metersocket base.

16. The device of claim 9 wherein said solid object is a bus bar.

17. The device of claim 9 wherein said lower support member has a first anchoring groove on the surface facing the cable cradle, and the cable cradle has a second anchoring groove on the surface facing said lower support member, said first anchoring groove capable of interlocking with said second anchoring groove to prevent the said hinged pivoting wall with the cable cradle from shifting away from said inner sidewall.

18. The device of claim 9 further comprising an anchoring hook on said hinged pivoting wall with the cable cradle closest to said upper member and a lip on said upper member configured to hold said anchoring hook to prevent movement of said hinged pivoting wall with the cable cradle toward said lower support member.

19. A method of securing a conductor wire to a solid object comprising:

a. placing said conductor wire on a pivoting wall with a cable cradle which extends from said pivoting wall into a recessed space, said pivoting wall with the cable cradle capable of pivoting into said recessed space said recessed space defined by an upper member, an inner sidewall, and a lower support member;

b. pivoting said pivoting wall with the cable cradle into said recessed space such that said conductor wire is located within said recessed space and such that a base of the cable cradle contacts an outer surface of said recessed space; and c. securing said conductor wire and said pivoting wall with the cable cradle, thereby preventing the movement of said conductor wire or said pivoting wall with the cable cradle by tightening a set screw over said wire.

20. The method of claim 19 wherein said pivoting wall with the cable cradle is made of metal.

21. The method of claim 19 wherein said solid object is a metersocket base.

\* \* \* \* \*